(12) United States Patent
Ochi et al.

(10) Patent No.: US 8,405,280 B2
(45) Date of Patent: Mar. 26, 2013

(54) COMPOSITE PIEZOELECTRIC BODY INCLUDING A PIEZOELECTRIC CERAMIC AND AN ORGANIC POLYMER MATERIAL CONTAINING AIR BUBBLES, METHOD FOR PRODUCING SAID COMPOSITE PIEZOELECTRIC BODY, AND COMPOSITE PIEZOELECTRIC ELEMENT USING SAID COMPOSITE PIEZOELECTRIC BODY

(75) Inventors: Takayuki Ochi, Osaka (JP); Hiroki Kubota, Osaka (JP)

(73) Assignee: Renesas Mobile Corporation, Tokyo (JP)

( * ) Notice: Subject to any disclaimer, the term of this patent is extended or adjusted under 35 U.S.C. 154(b) by 0 days.

(21) Appl. No.: 13/543,155

(22) Filed: Jul. 6, 2012

(65) Prior Publication Data

US 2012/0274178 A1 Nov. 1, 2012

Related U.S. Application Data

(63) Continuation of application No. PCT/JP2010/068839, filed on Oct. 25, 2010.

(30) Foreign Application Priority Data

Jan. 6, 2010 (JP) ................ 2010-001278

(51) Int. Cl.
*H01L 41/04* (2006.01)
*H01L 41/08* (2006.01)
(52) U.S. Cl. ...................... 310/328; 310/800
(58) Field of Classification Search .............. 310/334, 310/328, 800
See application file for complete search history.

(56) References Cited

U.S. PATENT DOCUMENTS

| 6,111,818 A * | 8/2000 | Bowen et al. ............. 367/140 |
| 6,225,728 B1 | 5/2001 | Gururaja |
| 7,053,531 B2 * | 5/2006 | Chisaka et al. ........... 310/334 |
| 2005/0174016 A1 | 8/2005 | Chisaka et al. |

FOREIGN PATENT DOCUMENTS

| JP | 5124188 A | 5/1993 |
| JP | 8126094 A | 5/1996 |
| JP | 2001015822 A | 1/2001 |
| JP | 2002217461 A | 8/2002 |
| JP | 2003309297 A | 10/2003 |

OTHER PUBLICATIONS

International Search Report mailed Nov. 22, 2010 issued in corresponding International Application No. PCT/JP2010/068839 and English language translation thereof (5 pages).

* cited by examiner

*Primary Examiner* — Jaydi San Martin
(74) *Attorney, Agent, or Firm* — Lucas & Mercanti LLP; Robert P. Michal

(57) ABSTRACT

[Object] There has been a need for a composite piezoelectric body and a composite piezoelectric element using the composite piezoelectric body which does not cause electrode defects, disconnection, and peeling even if the piezoelectric body is subjected to fine-pitch processing.
[Solution] A composite piezoelectric body of the present invention includes a piezoelectric ceramic and an organic polymer material containing air bubbles mixed therein, wherein among surfaces of the piezoelectric ceramic and the organic polymer material on which an electrode is to be formed, an insulating layer is formed on the entire or a portion of the surface of the organic polymer material on which the electrode is to be formed.

11 Claims, 4 Drawing Sheets

US 8,405,280 B2

COMPOSITE PIEZOELECTRIC BODY INCLUDING A PIEZOELECTRIC CERAMIC AND AN ORGANIC POLYMER MATERIAL CONTAINING AIR BUBBLES, METHOD FOR PRODUCING SAID COMPOSITE PIEZOELECTRIC BODY, AND COMPOSITE PIEZOELECTRIC ELEMENT USING SAID COMPOSITE PIEZOELECTRIC BODY

CROSS-REFERENCE TO RELATED APPLICATIONS

This is a continuation of PCT International Application PCT/JP2010/068839 filed Oct. 25, 2010, which in turn claims benefit of Japanese Patent Application No. JP 2010-001278 filed Jan. 6, 2010, the entire disclosure of each of which is incorporated herein by reference.

TECHNICAL FIELD

The present invention relates to a composite piezoelectric body and, in further detail, relates to a composite piezoelectric body without causing electrode defects, disconnection, and peeling, a method for producing the composite piezoelectric body, and a composite piezoelectric element using the composite piezoelectric body.

BACKGROUND ART

There have been developed various piezoelectric elements in which displacement applied from the outside can be converted into electricity or, conversely, applied electricity can be converted into displacement. The applicants of this application have also developed a composite piezoelectric element provided with a piezoelectric ceramic and an organic polymer material containing air bubbles mixed therein as described in Patent Literature 1.

The composite piezoelectric element described in Patent Literature 1 is produced through processing steps shown in FIG. 2(b).

That is, the composite piezoelectric element is produced by first performing grooving to form a plurality of grooves in the ceramic by machining, next performing filling to fill the grooves with a resin which evaporates at a predetermined temperature, then performing foaming to form the organic polymer material having air bubbles mixed therein by heat treatment of the resin at a temperature where the resin evaporates, then performing thickness processing to polish a composite material including the ceramic and the organic polymer material to a necessary thickness, then performing electrode formation processing on the polished surface, i.e., the surface on which an electrode is to be formed, and finally performing polarization processing.

Therefore, the composite piezoelectric element described in Patent Literature 1 includes the organic polymer material containing air bubbles mixed therein and thus has the advantage that acoustic impedance can be decreased while an electromechanical coupling coefficient which indicates the performance of a piezoelectric element is maintained high.

In addition, the composite piezoelectric body is usually expressed by "the number of XYZ directions in which piezoelectric ceramic can be exposed in end surfaces-the number of XYZ directions in which organic polymer material can be exposed in end surfaces", such as 1-3 type, 2-2 type, 0-3 type, 3-0 type, or the like.

CITATION LIST

Patent Literature

PTL 1: Japanese Patent No. 4222467

SUMMARY OF INVENTION

Technical Problem

The composite piezoelectric element described in Patent Literature 1 is mainly used as probes of transmitter-receivers such as ultrasonic diagnostic equipment, an ultrasonic flaw detector, and the like. As described in paragraph [0037] of Patent Literature 1, the composite piezoelectric element has been usually used by cutting to a width of at least about 0.1 mm and thus has caused no defect.

Namely, as described above, the composite piezoelectric element described in Patent Literature 1 contains air bubbles mixed in the organic polymer material, and thus when the vicinities of the surfaces of the organic polymer material are polished during thickness processing, depression holes 5 may be produced from air bubbles 4 present near the surfaces of an organic polymer material 3 by polishing as shown in FIG. 5.

However, even in the state where the depression holes are produced from the air bubbles 4 present in the surfaces of the organic polymer material by polishing, most of the depression holes are closed in the step of electrode formation processing, thereby causing substantially no defect during use. In addition, even in the state where the depression holes are open without being closed in a specified portion of the electrode surfaces, i.e., in the state where defects occur in the electrode surfaces, processing to a usual cutting width can create normal electric continuity unless defects occur in other portions, thereby causing substantially no defect during use.

However, in recent years, the probes have been required to be subjected to fine-pitch processing with a cutting width of 0.1 mm or less, and an attempt to realize such fine processing has infrequently produced defects in the composite piezoelectric element described in Patent Literature 1.

That is, in the case of fine-pitch processing which has recently been required, because of the narrow width of a piezoelectric element after processing, the problem of infrequently producing a piezoelectric element having many defective portions has been becoming manifest, and the problem of infrequently causing difficulty in achieving normal electric continuity has been produced.

The present invention has been achieved in consideration of the above-described conventional problems, and an object of the present invention is to provide a composite piezoelectric body without causing electrode defects, disconnection, and peeling, a method for producing the composite piezoelectric body, and a composite piezoelectric element using the composite piezoelectric body.

Solution to Problem

In order to achieve the object, a composite piezoelectric body of the present invention includes a piezoelectric ceramic and an organic polymer material containing air bubbles mixed therein, wherein among the surfaces of the piezoelectric ceramic and the organic polymer material on which an electrode is to be formed, an insulating layer is formed on the entire or a portion of the surface of the organic polymer material on which the electrode is to be formed.

In addition, the composite piezoelectric body of the present invention is characterized in that the thickness of the insulating layer is 50 μm or less.

Further, the composite piezoelectric body of the present invention is characterized in that the average bulk density of the organic polymer material and the insulating layer is 0.6 g/cm$^3$ or less.

Further, the composite piezoelectric body of the present invention is characterized in that the insulating layer is composed of an epoxy resin.

Further, a composite piezoelectric element of the present invention includes the composite piezoelectric body according to Claims 1 to 4 and an electrode formed thereon.

Further, a method for producing a composite piezoelectric body of the present invention passes through the steps of forming a plurality of grooves in a ceramic by machining, filling the grooves with a resin which is evaporated at a predetermined temperature, forming an organic polymer material containing air bubbles mixed therein by heat treatment at a temperature where the resin is evaporated, and forming an electrode, the method including a step of forming an insulating layer on the entire or a portion of a surface of the organic polymer material on which the electrode is to be formed.

Further, the method for producing a composite piezoelectric body of the present invention includes an electroless plating step as the step of forming the electrode.

Further, the method for producing a composite piezoelectric body of the present invention is characterized in that the electroless plating step is performed at 70° C. or less.

Each of the components of the present invention is described below.

The material and type of the piezoelectric ceramic used in the present invention are not particularly limited as long as displacement applied from the outside can be converted into electricity or, conversely, applied electricity can be converted into displacement.

Examples of the ceramic having these properties include barium titanate ceramics, lead titanate ceramics, lead zirconate titanate (PZT) ceramics, lead niobate ceramics, lithium niobate single crystals, lead zincate niobate titanate (PZNT) single crystals, lead magnesate niobate titanate (PMNT) single crystals, bismuth titanate ceramics, lead metaniobate ceramics, and the like.

The organic polymer material used in the present invention is not particularly limited as long as it can be filled between arranged piezoelectric ceramic columns to form the composite piezoelectric body and has insulation necessary for the composite piezoelectric body.

Examples of the organic polymer material having these properties include solidified products of thermosetting resins such as unsaturated polyester resins, allyl resins, epoxy resins, urethane resins, urea resins, melamine resins, phenol resins, and the like; and thermoplastic resins such as acrylonitrile copolymer resins, acrylonitrile-styrene copolymer resins, polyethylene resins, polypropylene resins, polystyrene resins, polyamide resins, polyacetal resins, polycarbonate resins, polyethyleneterephthalate resins, polybutyleneterephthalate resins, PMMA resins, and the like.

When a thermoplastic resin is used for the organic polymer material, in order to prevent softening of the organic polymer material during electroless plating described below, one having a melting point or glass transition temperature equal to or higher than the processing temperature of this processing step is preferably used.

In addition, the organic polymer material used in the present invention contains air bubbles mixed therein and has the effect that restriction of vibration of the piezoelectric ceramic can be reduced by the air bubbles when the piezoelectric element vibrates by applying electricity to the composite piezoelectric element, and the acoustic impedance can be decreased while an electromechanical coupling coefficient indicating the performance of the composite piezoelectric element is maintained high.

The method for mixing the air bubbles is not particularly limited as long as the method creates a condition where the organic polymer material is filled with the air bubbles when the composite piezoelectric body is finally formed. The organic polymer material in which the air bubbles are previously mixed may be charged or a resin mixed with a chemical which generates air bubbles may be charged and then heated to generate the air bubbles in the organic polymer material when the organic polymer material is formed by solidification or curing.

In addition, a method using a polymeric resin powder enclosing a liquid described in, for example, Japanese Patent No. 4222467 may be used. Specifically, in this method, the polymeric resin powder of an acrylonitrile copolymer, which encloses a liquid, such as normal pentane, normal hexane, isobutane, isopentane, or the like and which is designed to evaporate the liquid when the polymer is softened by heating to a predetermined temperature, is previously filled into grooves of the piezoelectric ceramic, heated to a predetermined temperature to evaporate the enclosed liquid and soften the polymeric resin, and then cooled to solidify the polymeric resin and form the organic polymer material, thereby including the evaporated gas as air bubbles in the organic polymer material.

The insulating layer of the present invention is not particularly limited as long as it is filled in depression holes appearing in a surface of the organic polymer material by thickness processing and contains substantially no air bubbles. However, from the viewpoint of easy handling and processing, the insulating layer is preferably formed using a resin material such as a thermosetting resin, a thermoplastic resin, or the like.

In addition, the composite piezoelectric body, excluding the piezoelectric ceramic, is generally preferably made of an insulator in order to efficiently transmit an electric signal to the piezoelectric ceramic from the electrode. However, when good performance such as an electromechanical coupling coefficient can be secured in the formed composite piezoelectric body, the material is not necessarily limited to the insulating layer, and a conductive resin can also be used.

When a thermoplastic resin is used for the insulating layer of the present invention, like in the organic polymer material, in order to prevent softening of the insulating layer during the electroless plating described below, one having a melting point or glass transition temperature equal to or higher than the processing temperature of this processing step is preferably used.

Further, the insulating layer can preferably secure adhesion to the electrode formed by the electrode formation processing.

Before polishing by thickness processing, the insulating layer is formed by applying the resin to the entire or a portion of the surface of the organic polymer material on which the electrode is to be formed and then curing the resin.

The thickness of the insulating layer of the present invention is preferably 50 μm or less and more preferably 30 or less because with an excessively large thickness, the electromechanical coupling coefficient is decreased, and the acoustic impedance is increased.

The average bulk density of the organic polymer material and the insulating layer of the present invention is preferably 0.6 g/cm³ or less and more preferably 0.5 g/cm³ or less because with an excessively high bulk density, vibration of ceramic in the composite piezoelectric element is restricted, the electromechanical coupling coefficient is decreased, and the acoustic impedance is increased.

In the method for producing a composite piezoelectric body of the present invention, the processing step of forming the insulating layer must be performed before the electrode formation processing because the insulating layer is adapted for preventing electrode defects, disconnection, and peeling.

In order to make it easy to adjust the thickness according to specifications, the processing step of forming the insulating layer is preferably performed before the thickness processing step. That is, as shown in FIG. 2(a), first, processing to form the insulating layer is performed after pre-polishing processing to generate depression holes in the surfaces of the organic polymer material, and then the thickness processing is performed to polish the composite piezoelectric body to a thickness according to specifications.

When a thickness according to specifications can be secured even after the processing to form the insulating layer, the processing step of forming the insulating layer may be performed after the thickness processing step.

After the thickness processing to polish the composite piezoelectric body to the necessary thickness, the electrode is formed on the polished surface, i.e., the surface on which the electrode is to be formed, thereby forming a composite piezoelectric element of the present invention.

In the method for producing a composite piezoelectric body of the present invention, a sputtering method, a vapor deposition method, or the like can be used in the processing step of forming the electrode. However, electroless plating with nickel or the like is preferred from the viewpoint of cost and adhesion to the electrode.

The electroless plating is preferably performed at a temperature which does not cause expansion of the air bubbles, specifically at 70° C. or less, because the electroless plating at an excessively high temperature causes expansion of the air bubbles formed in foaming processing and thus again generates projections and recessions in the surface of the organic polymer material in spite of polishing by the thickness processing.

After the electroless plating, if required, the electrode formation processing is performed by electrolytic plating with gold to form the composite piezoelectric element of the present invention.

Advantageous Effects of Invention

According to the composite piezoelectric body and the composite piezoelectric element using the composite piezoelectric body of the present invention, the composite piezoelectric body includes the piezoelectric ceramic and the organic polymer material containing air bubbles mixed therein, wherein among the surfaces of the piezoelectric ceramic and the organic polymer material, on which the electrode is to be formed, the insulating layer is formed on the entire or a portion of the surface of the organic polymer material, on which he electrode is to be formed. Therefore, the composite piezoelectric body and the composite piezoelectric element without causing electrode defects, disconnection, and peeling can be produced.

In addition, depression holes produced by thickness processing in the surface on which the electrode is to be formed are filled with the insulating layer, and thus the electrode can be more strongly bonded to the organic polymer material, thereby more enhancing strength of the piezoelectric element, improving handleability in cutting processing, and imparting a more advantageous effect on the prevention of electrode disconnection during processing.

In addition, since the composite piezoelectric body of the present invention is characterized in that the thickness of the insulating layer is 50 μm or less, it is possible to prevent electrode defects, disconnection, and peeling while maintaining the electromechanical coupling coefficient high and decreasing the acoustic impedance.

Further, since the composite piezoelectric body of the present invention is characterized in that the average bulk density of the organic polymer material and the insulating layer is 0.6 g/cm³ or less, it is possible to prevent electrode defects, disconnection, and peeling while maintaining the electromechanical coupling coefficient high and decreasing the acoustic impedance.

Further, since the composite piezoelectric body of the present invention is characterized in that the insulating layer is composed of an epoxy resin, it is possible to not only prevent electrode defects and disconnection but also more effectively prevent electrode peeling, and impart the effect of improving the strength of the composite piezoelectric element when the composite piezoelectric element is produced by further forming an electrode.

Further, according to the method for producing a composite piezoelectric body of the present invention, the method for producing a composite piezoelectric body passes through a step of forming a plurality of grooves in a ceramic by machining, a step of filling the grooves with a resin which is evaporated at a predetermined temperature, a step of forming an organic polymer material containing air bubbles mixed therein by heat treatment at a temperature where the resin is evaporated, and a step of forming an electrode, the method including a step of forming an insulating layer on the entire or a portion of the surface of the organic polymer material, on which the electrode is to be formed. Therefore, a composite piezoelectric body without causing electrode defects, disconnection, and peeling can be produced.

Further, the composite piezoelectric body of the present invention is characterized in that an electroless plating step is provided as the step of forming the electrode, and the electroless plating step is performed at 70° C. or less. Thus, it is possible to not only suppress softening of the resin but also prevent the occurrence of projections and depressions in the surface of the organic polymer material which has been polished by thickness processing, thereby producing a composite piezoelectric body without causing electrode defects, disconnection, and peeling.

BEST MODES FOR CARRYING OUT THE INVENTION

Figure 1:
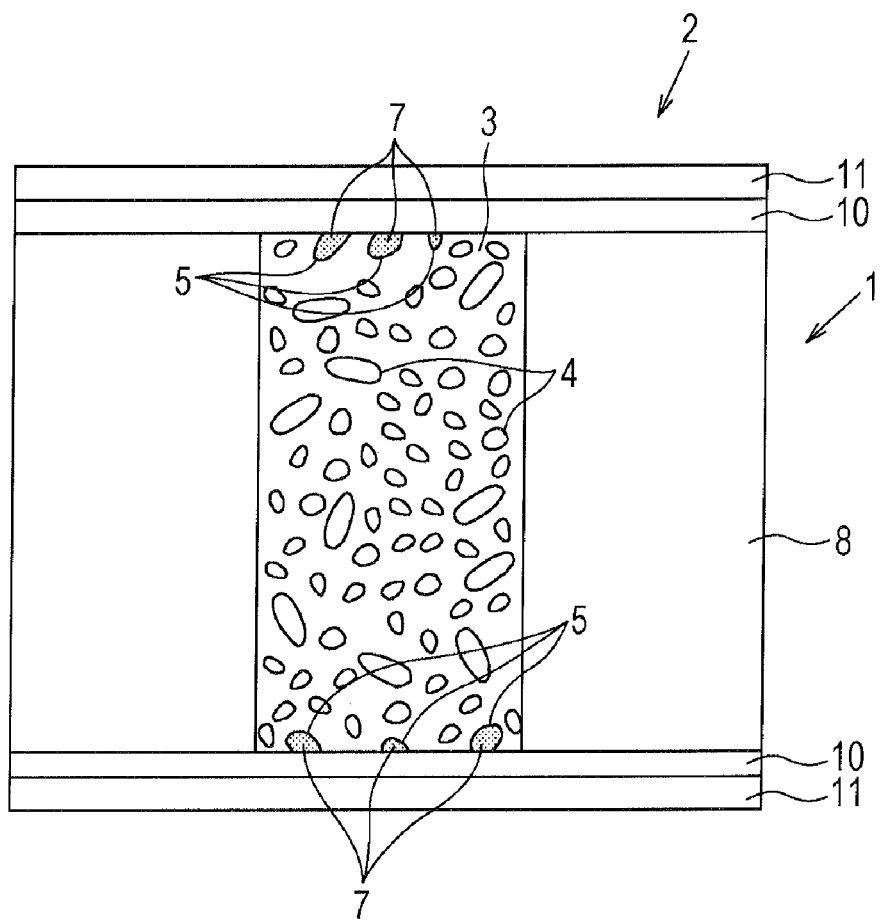
FIG. 1 is a schematic drawing showing a cross-section of a composite piezoelectric element of the present invention.

FIG. 1 is a schematic drawing showing a cross-section of a composite piezoelectric element of the present invention. In a composite piezoelectric body 1 and a composite piezoelectric element 2 of the present invention, as shown in FIG. 1, depression holes 5 produced from air bubbles 4 present near surfaces of an organic polymer material 3 by polishing are filled with an insulating layer 7.

Figure 2:
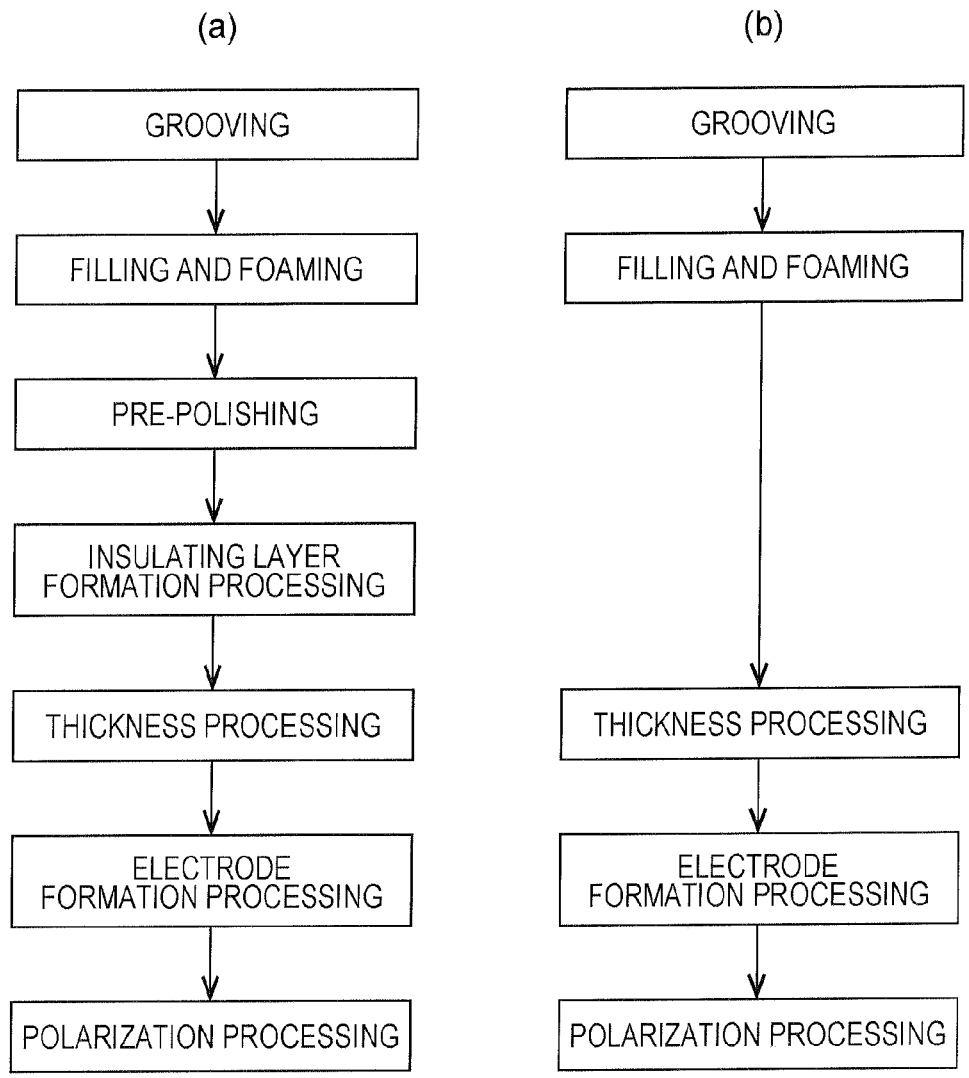
FIG. 2 is a flow diagram showing a method for producing a composite piezoelectric body and composite piezoelectric element of the present invention and a method for producing conventional ones.
Figure 3:
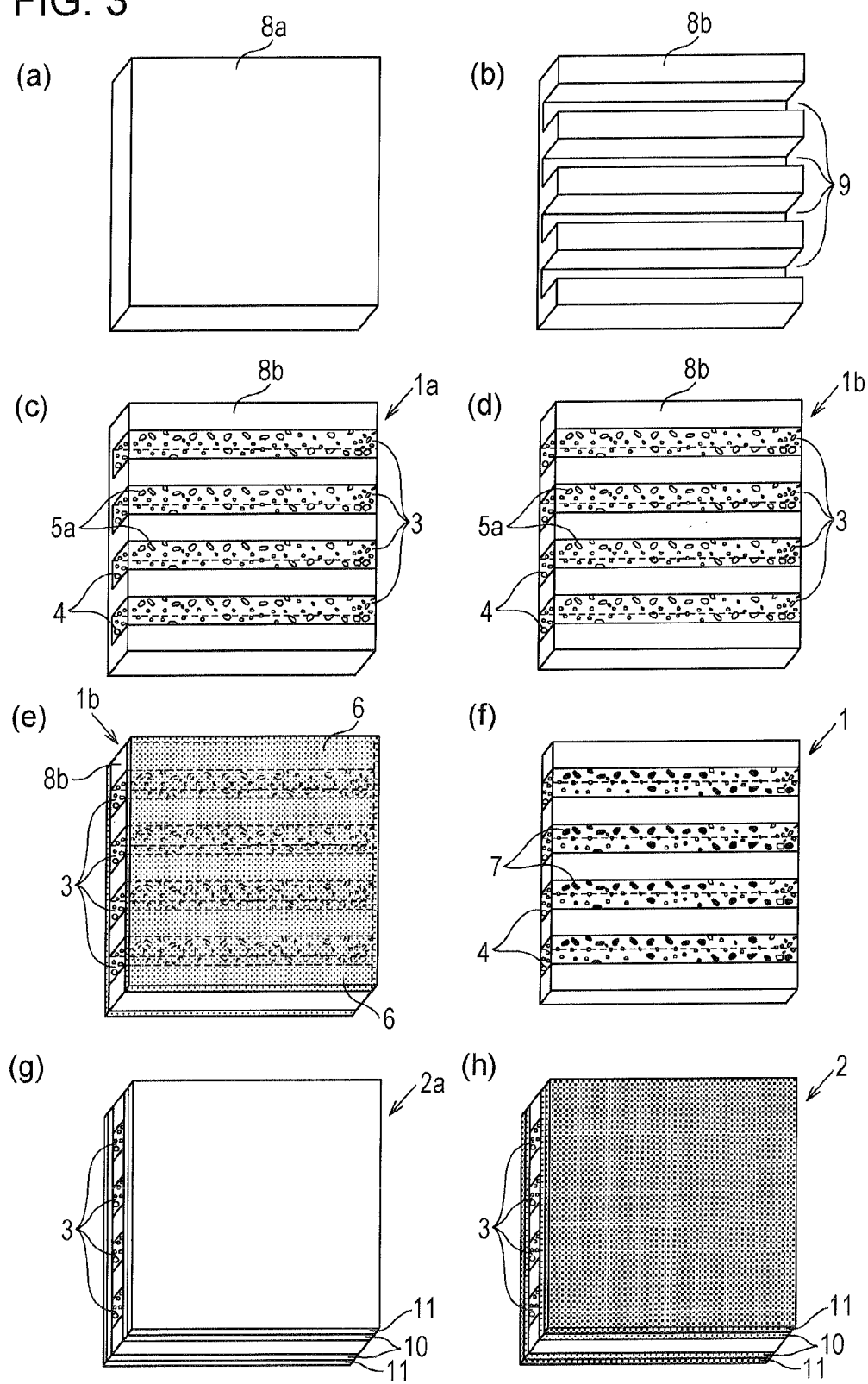
FIG. 3 is a schematic drawing showing steps for producing a composite piezoelectric body and composite piezoelectric element of the present invention.
Figure 4:
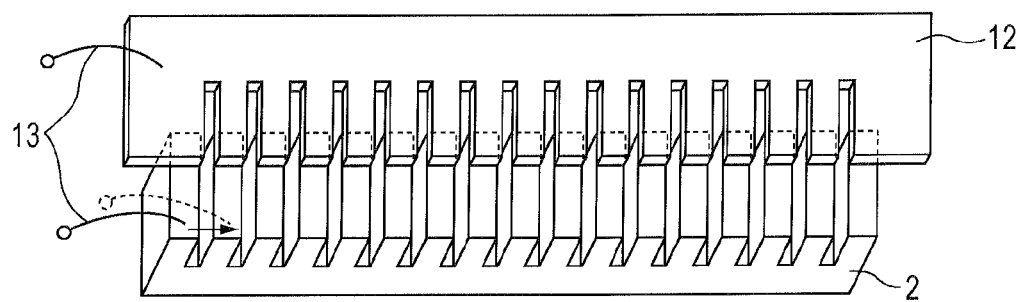
FIG. 4 is a drawing showing a continuity test method for a composite piezoelectric element of the present invention.
Figure 5:
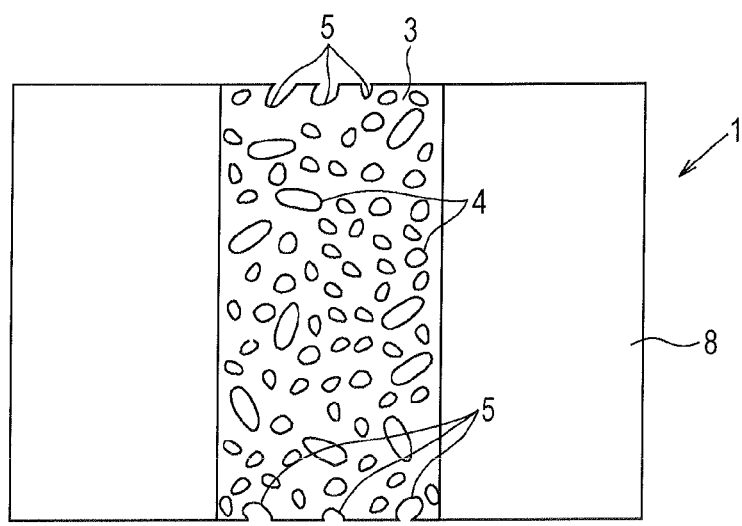
FIG. 5 is a schematic drawing showing a cross-section of a conventional composite piezoelectric body.

Next, the composite piezoelectric body of the present invention is described in detail based on examples and FIGS. 2 and 3. The present invention is not limited to the examples below. FIG. 2 is a flow diagram showing a method for producing a composite piezoelectric body and composite piezoelectric element of the present invention and a method for producing conventional ones, and FIG. 3 is a schematic drawing showing steps for producing a composite piezoelectric body and composite piezoelectric element of the present invention.

As shown in FIG. 2, FIG. 2(a) showing a production flow of the composite piezoelectric body of the present invention has steps of pre-polishing processing and insulating layer formation processing which are absent from FIG. 2(b) showing a production flow of a conventional composite piezoelectric body.

Example 1

First, a soft-type lead zirconate titanate ceramic powder (manufactured by Tayca Corp.: L-155N, electromechanical coupling coefficient $k_{33}$: 77%, relative dielectric constant: 5700, Curie temperature: 155° C.) was molded, degreased, and then fired at 1200° C. to form a lead zirconate titanate ceramic sintered body. The resultant lead zirconate titanate ceramic sintered body was processed with a surface grinder and a double-side polishing machine to produce a piezoelectric ceramic 8a having a length of 60 mm, a width of 10 mm, and a thickness of 0.80 mm shown in FIG. 3(a).

Next, grooves 9 having a depth of 0.60 mm were formed with a 30 µm-width blade of a dicing machine at a pitch of 100 µm in parallel with one of the sides of the rectangular plate-shaped piezoelectric ceramic 8a formed as described above, thereby producing a piezoelectric ceramic 8b shown in FIG. 3(b), in which a plurality of piezoelectric ceramic rectangular columns of 70 µm×60 mm×0.6 mm were erected.

Next, the grooves 9 formed in the piezoelectric ceramic 8b shown in FIG. 3(b) were filled with an acrylonitrile copolymer resin enclosing normal hexane and normal pentane and then heat-treated at 160° C. for 5 minutes to produce a composite piezoelectric body 1a filled with an organic polymer material 3 including a solidified product of the acrylonitrile copolymer resin in which air bubbles 4 were dispersed as shown in FIG. 3(c).

Next, as shown in FIG. 3(d), the excesses of the organic polymer material 3 and the piezoelectric ceramic 8b were removed by a double-side polishing machine to adjust the thickness, producing a composite piezoelectric body 1b. In addition, depression holes 5a were produced from the air bubbles 4 present near the surfaces of the organic polymer material 3 during polishing in the front and back surfaces of the composite piezoelectric body 1b.

Next, as shown in FIG. 3(e), an epoxy resin (bulk density: 1.3 g/cm³) was applied to the front and back surfaces of the composite piezoelectric body 1b by a squeegee method and cured by heating at 150° C. for 60 minutes to form epoxy resin layers 6.

Next, the excesses of the epoxy resin layers 6 and the piezoelectric ceramic 8b were again removed by final surface processing with a double-side polishing machine to produce a 2-2 type composite piezoelectric body 1 of 0.35 mm in thickness shown in FIG. 3(f) in which the depression holes 5a formed in FIG. 3(d) were filled with the insulating layers 7, the size of each of the columns of the columnar piezoelectric ceramic was 70µ×60 mm, and the volume ratio of the columnar piezoelectric ceramic was 70%.

Next, for the purpose of forming electrodes on the resultant composite piezoelectric body 1 having a structure in which the columns of 70 µm×60 mm were erected, the composite piezoelectric body 1 was subjected to electroless nickel plating 10 with a thickness of 0.5 µm at a plating bath temperature of 65° C. and further subjected to electrolytic gold plating 11 with a thickness of 0.5 µm. Then, the electrodes formed on the four peripheral side surfaces and unnecessary portions of the periphery of the composite piezoelectric body 1 were cut off with a dicing machine to produce a rectangular plate-shaped 2-2 type composite piezoelectric element 2a of 45 mm×5 mm×0.35 mm shown in FIG. 3(g), in which the electrodes were formed on the surfaces of the composite piezoelectric body 1.

Finally, polarization treatment was performed by applying a direct-current voltage of 1 kV/mm at 60° C. between both opposing electrodes of the rectangular plate-shaped 2-2 type composite piezoelectric element 2a, producing an intended 2-2 type composite piezoelectric element 2 shown in FIG. 3(h).

The geometrical size of the resultant composite piezoelectric element 2 was measured with a micrometer and a vernier caliper, and the weight was measured with a precision balance to calculate the bulk density of the composite piezoelectric element 2. As a result, the bulk density was 5.72 g/cm³.

In addition, the calculative bulk density of the polymer component in the composite piezoelectric body 1 was 0.37 g/cm³. Measurement of the thickness of the epoxy resin layer with a laser microscope showed the thickness of 30 µm.

Example 2

A 2-2 type composite piezoelectric element including a piezoelectric ceramic at a volume ratio of 70% was produced through the same steps as in Example 1 except that in Example 1, the thickness dimension was changed to 0.45 mm.

Example 3

A 2-2 type composite piezoelectric element including a piezoelectric ceramic at a volume ratio of 60% was produced through the same steps as in Example 1 except that the piezoelectric ceramic was formed so as to have a plurality of erect ceramic rectangular columns of 45 µm×60 mm×0.6 mm.

Example 4

A 2-2 type composite piezoelectric element including a piezoelectric ceramic at a volume ratio of 70% was produced through the same steps as in Example 1 except that in Example 1, the thickness dimension was changed to 0.14 mm.

Examples 5 to 7

2-2 type composite piezoelectric elements including epoxy resin layers having different thicknesses as shown in Table 1 and each including a piezoelectric ceramic at a volume ratio of 70% were produced through the same steps as in Example 1 except that in Example 4, the conditions of heat treatment after filling with the acrylonitrile copolymer resin enclosing normal hexane and normal pentane were changed.

Comparative Example 1

A piezoelectric ceramic in which a plurality of piezoelectric ceramic rectangular columns of 70 μm×60 mm×0.6 mm were erected was produced by the same method as in Example 1, and the grooves formed in the piezoelectric ceramic were filled with an acrylonitrile copolymer resin enclosing normal hexane and normal pentane and then heat-treated at 160° C. for 5 minutes to produce a composite piezoelectric body filled with an organic polymer material including a solidified product of the acrylonitrile copolymer resin in which air bubbles were dispersed.

Next, the excesses of the resin and the piezoelectric ceramic were removed with a double-side polishing machine to adjust the thickness, producing a 2-2 type composite piezoelectric body of 0.35 mm in thickness in which the size of each of the columns of the columnar piezoelectric ceramic was 70 μm×60 mm, and the volume ratio of the columnar piezoelectric ceramic was 70%.

Next, a rectangular plate-shaped 2-2 type composite piezoelectric element of 45 mm×5 mm×0.35 mm including the piezoelectric ceramic at a volume ratio of 70% was produced through the same steps as in Example 1 except that the insulating layer was not provided.

Next, the electromechanical coupling coefficient ($k_t$) in the thickness direction of each of the 2-2 type composite piezoelectric elements produced as described above in Examples 1 to 3 and Comparative Example 1 was calculated. Specifically, frequency-impedance characteristics were measured with impedance analyzer 4294A manufactured by Agilent Technologies Inc., and calculation was made based on the resultant resonance frequency ($f_r$) and antiresonance frequency ($f_a$) of longitudinal vibration (thickness vibration) according to JEITA standard EM-4501 (test methods for piezoelectric ceramic vibrators). In addition, the acoustic impedance was calculated from the resonance frequency ($f_r$) and the thickness of the element. The results are summarized in Table 1.

The term "electromechanical coupling coefficient" refers to a coefficient that indicates the efficiency of conversion of the electric energy applied to a piezoelectric element into mechanical energy or, conversely, conversion of mechanical energy of vibration or the like into electric energy, and shows that the higher the coefficient, the more efficiently electric energy and mechanical energy can be converted to each other.

Next, in each of the 2-2 type composite piezoelectric elements of Examples 1 to 3 and Comparative Example 1, grooves were formed with a 30 μm-width blade of a dicing machine at a pitch of 50 μm in a direction along the end surfaces so that the cutting depth was ½ of the element thickness, thereby forming an array by dividing the element.

Then, a continuity test was conducted for the array using a tester to confirm the number of continuity defects in the array.

(Continuity Test)

The continuity test was conducted by soldering a copper thin foil 12 to the upper end of the composite piezoelectric element 2, partially cutting out the foil 12, and then bringing an electrode 13 into contact with each of the lower end portions of the composite piezoelectric element 2 to test whether or not electric continuity was secured. The results are summarized in Table 1.

TABLE 1

| Characteristic item | Example 1 | Example 2 | Example 3 | Example 4 | Example 5 | Example 6 | Example 7 | Comparative Example 1 |
|---|---|---|---|---|---|---|---|---|
| Thickness of epoxy layer (μm) | 30 | 28 | 27 | 9 | 28 | 50 | 60 | 0 |
| Average bulk density of organic polymer material and epoxy resin (g/cm³) | 0.37 | 0.35 | 0.37 | 0.36 | 0.47 | 0.59 | 0.64 | 0.3 |
| $k_t$ (%) | 68.5 | 69.2 | 68.2 | 63.9 | 61.9 | 60.5 | 59.7 | 68.8 |
| Acoustic impedance (Mrayl) | 22 | 21 | 17 | 21 | 21 | 22 | 23 | 20 |
| Defect: defective continuity rate of 50 μm-width cut array (%) | 0 | 0 | 0 | 0 | 0 | 0 | 0 | 0.6 |

The results shown in Table 1 indicate that in each of the composite piezoelectric elements of Examples 1 to 3, the acoustic impedance can be decreased while the electromechanical coupling coefficient is maintained high and to suppress the occurrence of electrode defects, disconnection, and peeling.

On the other hand, in the composite piezoelectric element of Comparative Example 1, defective continuity is slightly observed, and thus it is found that it is difficult to suppress the occurrence of electrode defects, disconnection, and peeling during fine-pitch processing.

In addition, in any one of the composite piezoelectric elements of Examples 1 to 7 and Comparative Example 1, the electromechanical coupling coefficient can be maintained in a high level of about 60% or more with low acoustic impedance, and thus the composite piezoelectric element is found to have good performance.

INDUSTRIAL APPLICABILITY

A composite piezoelectric body of the present invention can be used as a sensing material which converts an electric signal into a displacement in a medical ultrasonic device, an aerial ultrasonic device, an underwater ultrasonic device, a solid-state ultrasonic device, and other ultrasonic devices, a sensing material which converts a displacement into an electric signal in an acceleration sensor, etc.

| Reference Signs List | |
|---|---|
| 1 | composite piezoelectric body |
| 1a | composite piezoelectric body |
| 1b | composite piezoelectric body |
| 2 | composite piezoelectric element |
| 2a | composite piezoelectric element |
| 3 | organic polymer material |
| 4 | air bubble |
| 5 | depression hole |
| 5a | depression hole |
| 6 | epoxy resin layer |
| 7 | insulating layer |
| 8 | piezoelectric ceramic |
| 8a | piezoelectric ceramic |
| 8b | piezoelectric ceramic |
| 9 | groove |
| 10 | electroless plated layer |
| 11 | gold plated layer |
| 12 | copper foil |
| 13 | electrode |

The invention claimed is:

1. A composite piezoelectric body comprising a piezoelectric ceramic and an organic polymer material containing air bubbles mixed therein which form depression holes on a surface of the organic polymer material,
wherein among surfaces of the piezoelectric ceramic and the organic polymer material on which an electrode is to be formed, an insulating layer is disposed on the entire or a portion of the surface of the organic polymer material on which the electrode is to be formed, the insulating layer at least substantially filling the depression holes present in the surface of the organic polymer material.

2. The composite piezoelectric body according to claim 1, wherein the thickness of the insulating layer is 50 μm or less.

3. The composite piezoelectric body according to claim 1, wherein the average bulk density of the organic polymer material and the insulating layer is 0.6 g/cm$^3$ or less.

4. The composite piezoelectric body according to claim 1, wherein the insulating layer is composed of an epoxy resin.

5. A composite piezoelectric element comprising the composite piezoelectric body according to claim 1 and an electrode formed thereon.

6. A composite piezoelectric element comprising the composite piezoelectric body according to claim 2 and an electrode formed thereon.

7. A composite piezoelectric element comprising the composite piezoelectric body according to claim 3 and an electrode formed thereon.

8. A composite piezoelectric element comprising the composite piezoelectric body according to claim 4 and an electrode formed thereon.

9. A method for producing a composite piezoelectric body comprising a piezoelectric ceramic and an organic polymer material containing air bubbles mixed therein which form depression holes on a surface of the organic polymer material,
wherein among surfaces of the piezoelectric ceramic and the organic polymer material on which an electrode is to be formed, an insulating layer is disposed on the entire or a portion of the surface of the organic polymer material on which the electrode is to be formed, the method comprising the steps of:
forming a plurality of grooves in a ceramic by machining;
filling the grooves with a resin which evaporates at a predetermined temperature;
forming the organic polymer material containing air bubbles mixed therein by heat treatment at a temperature where the resin evaporates, the air bubbles forming depression holes on a surface of the organic polymer material; and
forming the electrode,
wherein the method further comprises a step of forming the insulating layer on the entire or a portion of a surface of the organic polymer material on which the electrode is to be formed, the insulating layer at least substantially filling the depression holes present on the surface of the organic polymer material.

10. The method for producing a composite piezoelectric body according to claim 9, comprising an electroless plating step as the step of forming the electrode.

11. The method for producing a composite piezoelectric body according to claim 10, wherein the electroless plating step is performed at 70° C. or less.

* * * * *

UNITED STATES PATENT AND TRADEMARK OFFICE
CERTIFICATE OF CORRECTION

PATENT NO. : 8,405,280 B2
APPLICATION NO. : 13/543155
DATED : March 26, 2013
INVENTOR(S) : Takayuki Ochi et al.

It is certified that error appears in the above-identified patent and that said Letters Patent is hereby corrected as shown below:

On item (73) of the title page of the patent,

"Assignee: Renesas Mobile Corporation, Tokyo (JP)" should read:

-- Assignee: Tayca Corporation, Osaka (JP) --.

Signed and Sealed this
Twenty-third Day of July, 2013

Teresa Stanek Rea
*Acting Director of the United States Patent and Trademark Office*